(12) United States Patent
Awaji et al.

(10) Patent No.: US 7,123,025 B2
(45) Date of Patent: Oct. 17, 2006

(54) DIFFERENTIAL COMPARATOR CIRCUIT, TEST HEAD, AND TEST APPARATUS

(75) Inventors: Toshiaki Awaji, Tokyo (JP); Takashi Sekino, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/202,391

(22) Filed: Aug. 11, 2005

(65) Prior Publication Data

US 2006/0033509 A1 Feb. 16, 2006

Related U.S. Application Data

(63) Continuation of application No. PCT/JP05/14543, filed on Aug. 8, 2005.

(30) Foreign Application Priority Data

Aug. 16, 2004 (JP) .............................. 2004-236808

(51) Int. Cl.
*G01R 27/28* (2006.01)

(52) U.S. Cl. ...................................... 324/647; 324/606

(58) Field of Classification Search ................ 324/606, 324/647
See application file for complete search history.

(56) References Cited

U.S. PATENT DOCUMENTS

| 6,429,695 | B1* | 8/2002 | Miyabe et al. ................. 327/57 |
| 6,462,558 | B1* | 10/2002 | Taurand ....................... 324/606 |
| 6,836,127 | B1* | 12/2004 | Marshall et al. ............ 324/606 |

* cited by examiner

*Primary Examiner*—Walter Benson
(74) *Attorney, Agent, or Firm*—Osha Liang LLP

(57) ABSTRACT

There is provided a differential comparator circuit that is mounted on a test apparatus for testing a device under test outputting differential signals including noninverted signals and inverted signals. The differential comparator circuit includes: a difference signal subtracting circuit operable to compute and output a difference signal indicative of a difference between the noninverted signal and the inverted signal; a first threshold value subtracting circuit operable to compute and output a first threshold voltage indicative of a difference between a first comparative voltage generated based on ground potential of the device under test and a reference voltage generated based on the ground potential of the device under test; and a first comparing circuit operable to compare the difference signal and the first threshold voltage to output a comparison result.

7 Claims, 4 Drawing Sheets

DIFFERENTIAL COMPARATOR CIRCUIT, TEST HEAD, AND TEST APPARATUS

CROSS REFERENCE TO THE RELATED APPLICATION

This patent application claims priority from a Japanese Patent Application No. 2004-236808 filed on Aug. 16, 2004, the contents of which are incorporated herein by reference.

BACKGROUND OF THE INVENTION

1. Field of the Invention

The present invention relates to a differential comparator circuit, a test head, and a test apparatus. More particularly, the present invention relates to a differential comparator circuit that is mounted on a test apparatus for testing a device under test outputting differential signals.

2. Description of Related Art

FIG. 1 shows a configuration of a test apparatus 10 according to a conventional art. The test apparatus 10 includes a subtraction circuit 14, an H side comparing circuit 16, and an L side comparing circuit 18. The subtraction circuit 14 amplifies differential signals output from a device under test (hereinafter, referred to as DUT) 12 with an amplification factor $\alpha$, and takes and outputs a difference. Then, the H side comparing circuit 16 compares the signals output from the subtraction circuit 14 with an H side threshold value (VrefH) to output a comparison result. Moreover, the L side comparing circuit 18 compares the signals output from the subtraction circuit 14 with an L side threshold value (VrefL) to output a comparison result. In this manner, the test apparatus 10 measures a cross-point of the differential signals output from the DUT 12 by providing the subtraction circuit 14. When the amplification factor $\alpha$ is constant in such a subtraction circuit 14, it is possible to measure the cross-point of the differential signals output from the DUT 12.

FIG. 2 shows a first example of a configuration of an amplifying circuit included in the subtraction circuit 14 according to a conventional art. When a gain G is very large in the amplifying circuit shown in FIG. 2, the amplification factor $\alpha = -R_{OUT}/R_{IN}$, and thus nonlinearity of the gain G can be ignored. However, it is difficult that such an amplifying circuit increases a gain to realize speedup.

FIG. 3 shows a second example of a configuration of an amplifying circuit included in the subtraction circuit 14 according to a conventional art. Although the amplifying circuit shown in FIG. 3 can realize speedup, a gain is small. Therefore, since nonlinearity of the gain becomes large, it is impossible to hold an amplification factor constant.

SUMMARY OF THE INVENTION

Therefore, it is an object of the present invention to provide a test apparatus that can solve the foregoing problems. The above and other objects can be achieved by combinations described in the independent claims. The dependent claims define further advantageous and exemplary combinations of the present invention.

According to the first aspect of the present invention, there is provided a differential comparator circuit that is mounted on a test apparatus for testing a device under test outputting differential signals including noninverted signals and inverted signals. The differential comparator circuit includes: a difference signal subtracting circuit operable to compute and output a difference signal indicative of a difference between the noninverted signal and the inverted signal; a first threshold value subtracting circuit operable to compute and output a first threshold voltage indicative of a difference between a first comparative voltage generated based on ground potential of the device under test and a reference voltage generated based on the ground potential of the device under test; and a first comparing circuit operable to compare the difference signal and the first threshold voltage to output a comparison result.

The difference signal subtracting circuit may amplify the difference between the noninverted signal and the inverted signal at a predetermined amplification factor to output the difference signal, and the first threshold value subtracting circuit may amplify the difference between the first comparative voltage and the reference voltage at the same predetermined amplification factor as that of the difference signal subtracting circuit in order to output the first threshold voltage.

The differential comparator circuit may further include: a second threshold value subtracting circuit operable to compute and output a second threshold voltage indicative of a difference between a second comparative voltage generated based on the ground potential of the device under test and a reference voltage generated based on the ground potential of the device under test; and a second comparing circuit operable to compare the difference signal and the second threshold voltage and output a comparison result, in which the first comparing circuit may detect and output that the difference signal is larger than the first threshold voltage, and the second comparing circuit may detect and output that the difference signal is smaller than the second threshold voltage.

The first comparing circuit may detect and output that the inverted signal is larger than the noninverted signal, and the second comparing circuit may detect and output that the inverted signal is smaller than the noninverted signal.

The difference signal subtracting circuit may amplify the difference between the noninverted signal and the inverted signal at a predetermined amplification factor to output the difference signal, and the second threshold value subtracting circuit may amplify the difference between the second comparative voltage and the reference voltage at the same predetermined amplification factor as that of said difference signal subtracting circuit in order to output the second threshold voltage.

According to the second aspect of the present invention, there is provided a test head of a test apparatus that tests a device under test outputting differential signals including noninverted signals and inverted signals. The test head includes a test module operable to measure the differential signals, the test module including: a difference signal subtracting circuit that computes and outputs a difference signal indicative of a difference between the noninverted signal and the inverted signal; a first threshold value subtracting circuit that computes and outputs a first threshold voltage indicative of a difference between a first comparative voltage generated based on ground potential of the device under test and a reference voltage generated based on the ground potential of the device under test; and a first comparing circuit that compares the difference signal and the first threshold voltage to output a comparison result.

According to the third aspect of the present invention, there is provided a test apparatus that tests a device under test outputting differential signals including noninverted signals and inverted signals. The test apparatus includes a test module operable to measure the differential signals, the test module including: a difference signal subtracting circuit that computes and outputs a difference signal indicative of a difference between the noninverted signal and the inverted signal; a first threshold value subtracting circuit that computes and outputs a first threshold voltage indicative of a difference between a first comparative voltage generated based on ground potential of the device under test and a reference voltage generated based on the ground potential of the device under test; and a first comparing circuit that compares the difference signal and the first threshold voltage to output a comparison result.

The summary of the invention does not necessarily describe all necessary features of the present invention. The present invention may also be a sub-combination of the features described above.

According to the present invention, it is possible to provide a differential comparator circuit that can accurately measure a differential signal.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
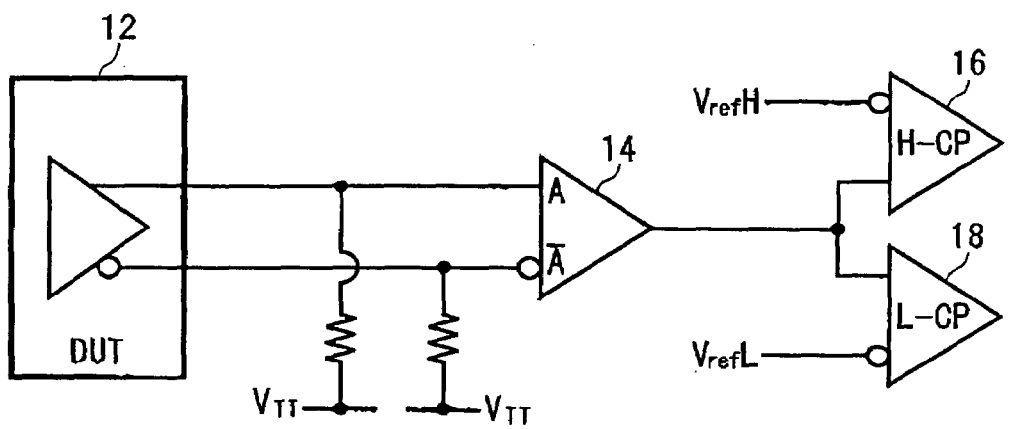
FIG. 1 is a view showing a configuration of a test apparatus according to a conventional art.
Figure 2:
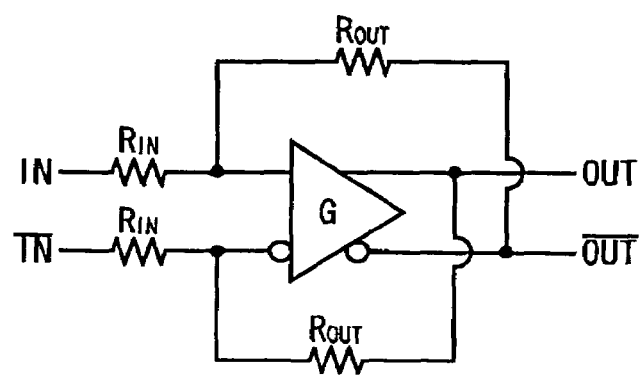
FIG. 2 is a view showing a first example of a configuration of an amplifying circuit included in a subtraction circuit.
Figure 3:
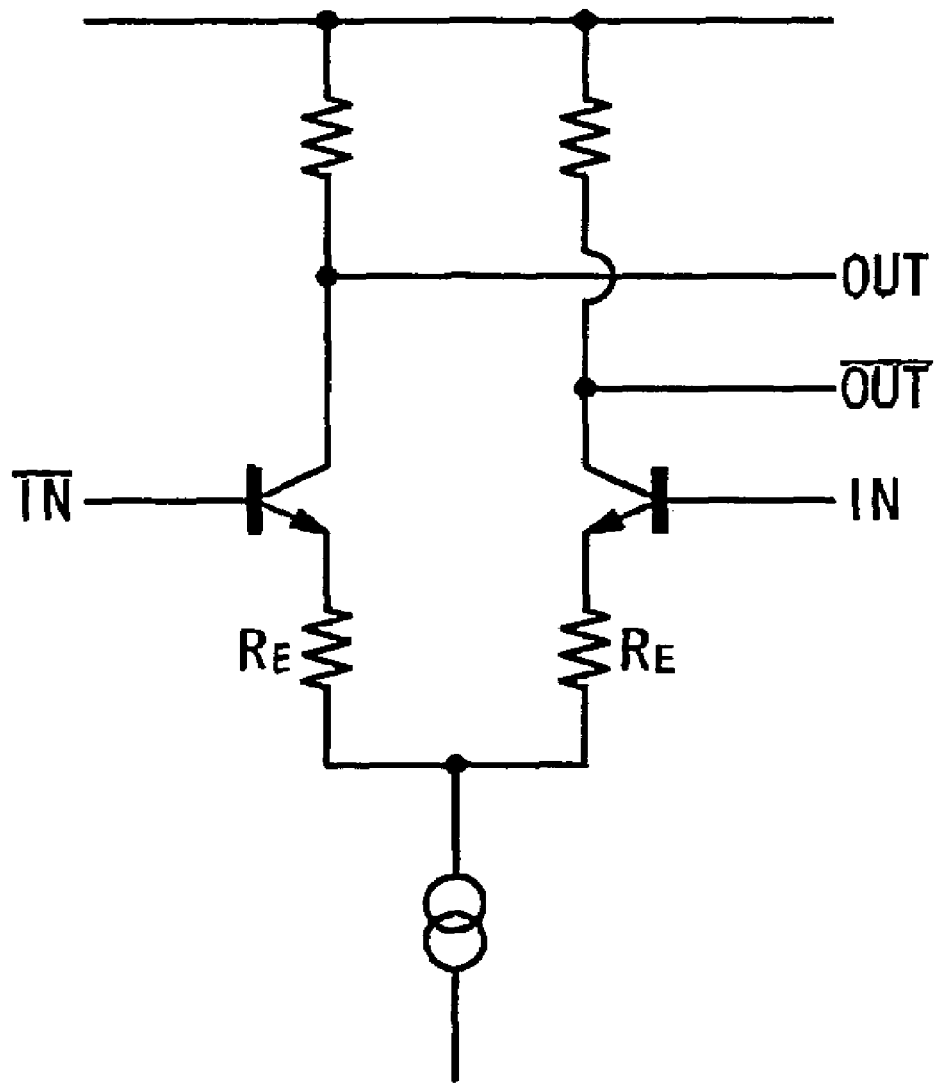
FIG. 3 is a view showing a second example of a configuration of the amplifying circuit included in the subtraction circuit.
Figure 4:
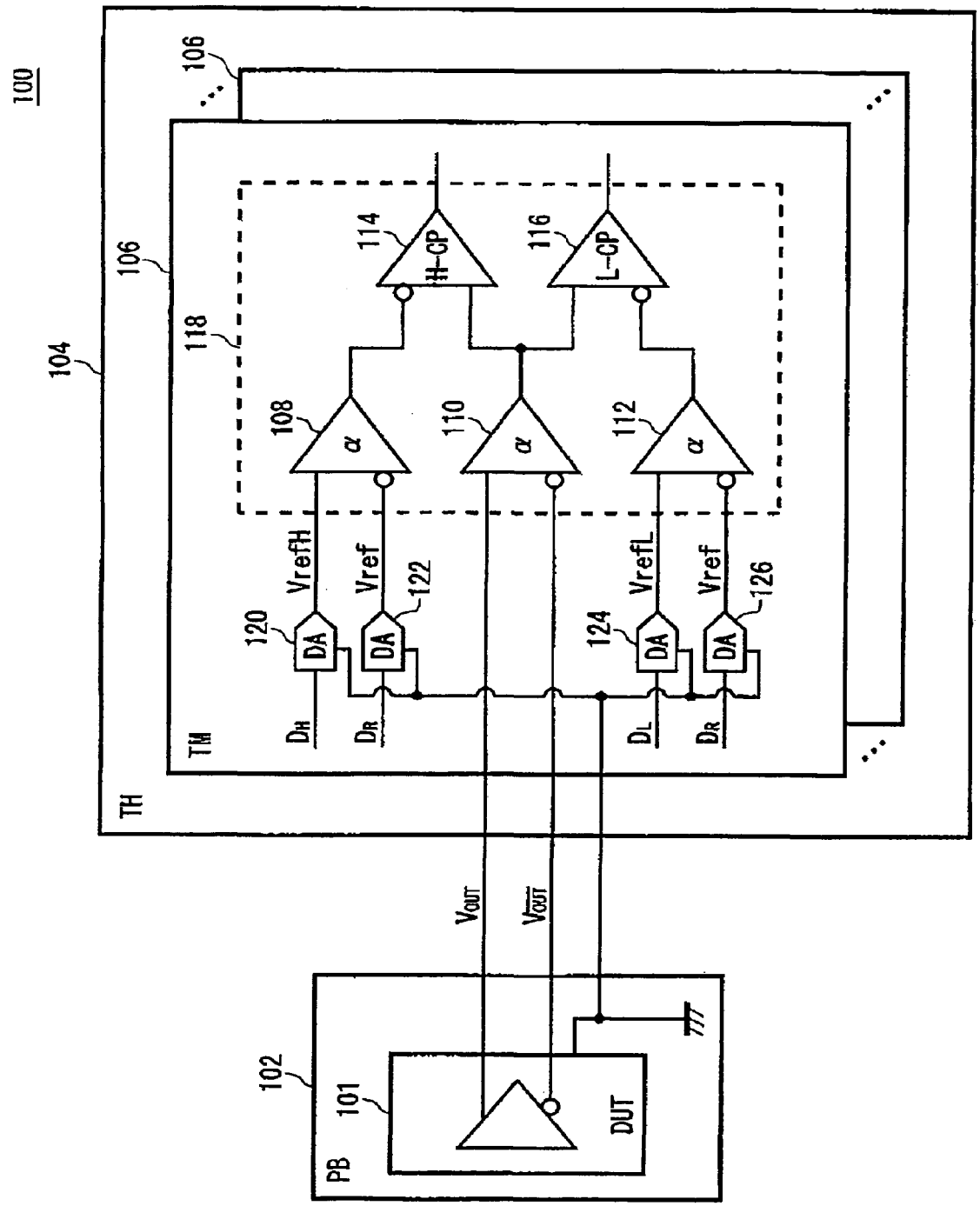
FIG. 4 is a view exemplary showing a configuration of a test apparatus according to an embodiment of the present invention.

FIG. 4 is a view exemplary showing a configuration of a test apparatus 100 according to an embodiment of the present invention. The test apparatus 100 includes a performance board (PB) 102 on which a DUT 101 is mounted on and a test head 104 that has a plurality of test modules 106 therein. The plurality of test modules 106 mounted on the test head 104 includes a test module for an analog test, a test module for a digital test, etc. However, in the present embodiment, it will be described about a configuration and an operation of the test module 106 for testing the DUT 101 that outputs differential signals including noninverted signals and inverted signals.

The test module 106 has a differential comparator circuit 118, which includes a first threshold value subtracting circuit 108, a difference signal subtracting circuit 110, a second threshold value subtracting circuit 112, an H side comparing circuit 114, and an L side comparing circuit 116, and DA converters 120, 122, 124, and 126. The first threshold value subtracting circuit 108, the difference signal subtracting circuit 110, and the second threshold value subtracting circuit 112 are a subtraction circuit that uses an operational amplifier having the same gain, and amplify signals input with the same amplification factor α.

The difference signal subtracting circuit 110 inputs the noninverted signals output from the DUT 101 from its positive input terminal, and inputs the inverted signals output from the DUT 101 from its negative input terminal. Then, the difference signal subtracting circuit 110 computes and outputs a difference signal indicative of a difference between the noninverted signal and the inverted signal by amplifying the difference between the noninverted signal and the inverted signal at a predetermined amplification factor α, and supplies it to the H side comparing circuit 114 and the L side comparing circuit 116.

The DA converter 120 generates a first comparative voltage (VrefH) from a first comparative voltage data ($D_H$) to supply it to the first threshold value subtracting circuit 108 using ground potential of the DUT 101 supplied from the performance board (PB) 102 as a standard. Moreover, the DA converter 122 generates a reference voltage (Vref) from a reference voltage data ($D_R$) to supply it to the first threshold value subtracting circuit 108 using the ground potential of the DUT 101 supplied from the performance board (PB) 102 as a standard. Moreover, the DA converter 124 generates a second comparative voltage (VrefL) from a second comparative voltage data ($D_L$) to supply it to the second threshold value subtracting circuit 112 using the ground potential of the DUT 101 supplied from the performance board (PB) 102 as a standard. Moreover, the DA converter 126 generates the reference voltage (Vref) from the reference voltage data ($D_R$) to supply it to the second threshold value subtracting circuit 112 using the ground potential of the DUT 101 supplied from the performance board (PB) 102 as a standard.

In addition, the differential comparator circuit 118 may not have the DA converters 122 and 126. In this case, the ground potential of the DUT 101 supplied from the performance board (PB) 102 may be supplied to the first threshold value subtracting circuit 108 and the second threshold value subtracting circuit 112 as the reference voltage (Vref).

The first threshold value subtracting circuit 108 inputs the first comparative voltage (VrefH) generated by the DA converter 120 based on the ground potential of the DUT 101 from the positive input terminal, and inputs the reference voltage (Vref) generated by the DA converter 122 based on the ground potential of the DUT 101 from the negative input terminal. Then, the first threshold value subtracting circuit 108 computes and outputs a first threshold voltage indicative of a difference between the first comparative voltage (VrefH) and the reference voltage (Vref) and supplies it to the H side comparing circuit 114 by amplifying the difference between the first comparative voltage (VrefH) and the reference voltage (Vref) at the same predetermined amplification factor α as that of the difference signal subtracting circuit 110.

The second threshold value subtracting circuit 112 inputs the second comparative voltage (VrefL) generated by the DA converter 124 based on the ground potential of the DUT 101 from the positive input terminal, and inputs the reference voltage (Vref) generated by the DA converter 126 based on the ground potential of the DUT 101 from the negative input terminal. Then, the second threshold value subtracting circuit 112 computes and outputs a second threshold voltage indicative of a difference between the second comparative voltage (VrefL) and the reference voltage (Vref) and supplies it to the L side comparing circuit 116 by amplifying the difference between the second comparative voltage (VrefL) and the reference voltage (Vref) at the same predetermined amplification factor α as that of the difference signal subtracting circuit 110.

The first comparative voltage (VrefH), the second comparative voltage (VrefL), and the reference voltage (Vref) are generated by DA converting circuits connected to the ground potential of the DUT 101, and are supplied to the first threshold value subtracting circuit 108 and the second threshold value subtracting circuit 112.

The H side comparing circuit 114 inputs the difference signal supplied from the difference signal subtracting circuit 110 and the first threshold voltage supplied from the first threshold value subtracting circuit 108. Then, the H side comparing circuit 114 compares the difference signal and the first threshold voltage, and detects that the difference signal is larger than the first threshold voltage to output its result as a comparison result. In other words, the H side comparing circuit 114 detects that the inverted signal included in the differential signal output from the DUT 101 is larger than the noninverted signal in order to output its result.

The L side comparing circuit 116 inputs the difference signal supplied from the difference signal subtracting circuit 110 and the second threshold voltage supplied from the second threshold value subtracting circuit 112. Then, the L side comparing circuit 116 compares the difference signal and the second threshold voltage, and detects that the difference signal is smaller than the second threshold voltage to output its result as a comparison result. In other words, the L side comparing circuit 116 detects that the inverted signal included in the differential signal output from the DUT 101 is smaller than the noninverted signal in order to output its result.

As described above, by providing the first threshold value subtracting circuit 108 and the second threshold value subtracting circuit 112 having the same gain as that of the difference signal subtracting circuit 110, it is possible to reduce a measurement error by nonlinearity of the gain of the difference signal subtracting circuit 110 and to accurately measure a cross-point of the differential signals. Therefore, according to the test apparatus 100 including the differential comparator circuit 118, it is possible to test the DUT 101 that outputs the differential signals with high precision.

Moreover, since a common noise from the ground potential of the DUT 101 is superimposed on all of the differential signal input into the difference signal subtracting circuit 110, the first comparative voltage (VrefH) and the reference voltage (Vref) input into the first threshold value subtracting circuit 108, and the second comparative voltage (VrefL) and the reference voltage (Vref) input into the second threshold value subtracting circuit 112, the common noise is removed by the difference signal subtracting circuit 110, the first threshold value subtracting circuit 108, and the second threshold value subtracting circuit 112, and thus the accurate comparison result can be output from the H side comparing circuit 114 and the L side comparing circuit 116. Therefore, according to the test apparatus 100 including the differential comparator circuit 118, it is possible to test the DUT 101 that outputs the differential signals with high precision.

Figure 5:
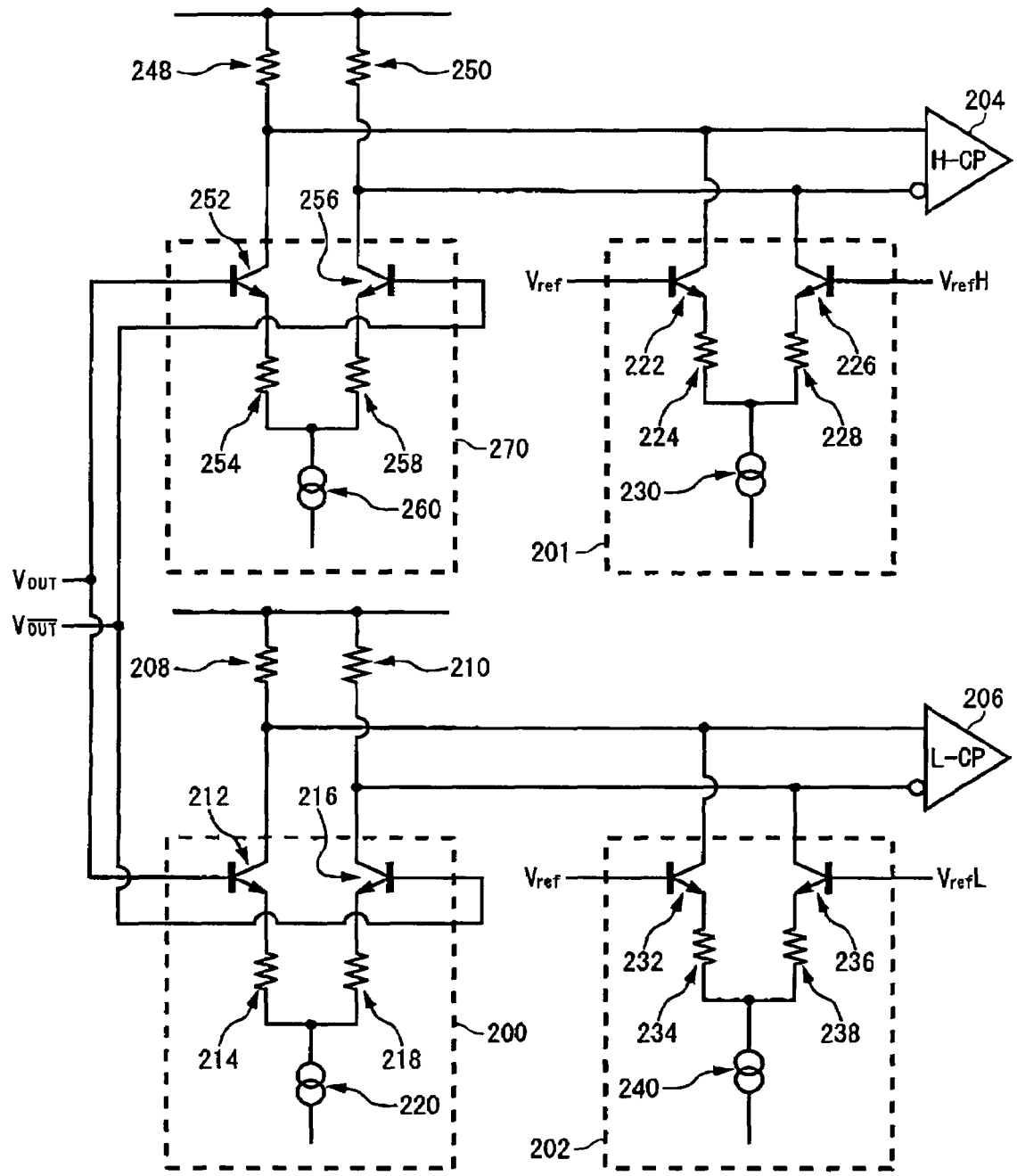
FIG. 5 is a view showing an alternative example of a differential comparator circuit.

FIG. 5 shows an alternative example of a configuration of the differential comparator circuit 118 according to the present embodiment. The differential comparator circuit 118 according to this example has a first differential signal amplifying unit 200, a second differential signal amplifying unit 270, a first threshold value amplifying unit 201, a second threshold value amplifying unit 202, an H side comparing circuit 204, an L side comparing circuit 206, a resistor 208, a resistor 210, a resistor 248, and a resistor 250. The first differential signal amplifying unit 200 includes a transistor 212, a resistor 214, a transistor 216, a resistor 218, and a current source 220. The second differential signal amplifying unit 270 includes a transistor 252, a resistor 254, a transistor 256, a resistor 258, and a current source 260. The first threshold value amplifying unit 201 includes a transistor 222, a resistor 224, a transistor 226, a resistor 228, and a current source 230. The second threshold value amplifying unit 202 includes a transistor 232, a resistor 234, a transistor 236, a resistor 238, and a current source 240.

A differential amplification circuit is made up of the first differential signal amplifying unit 200 and the resistors 208 and 210, a differential amplification circuit is made up of the second differential signal amplifying unit 270 and the resistors 248 and 250, a differential amplification circuit is made up of the first threshold value amplifying unit 201 and the resistors 208 and 210, and a differential amplification circuit is made up of the second threshold value amplifying unit 202 and the resistors 208 and 210. In addition, the first differential signal amplifying unit 200, the second differential signal amplifying unit 270, the first threshold value amplifying unit 201, and the second threshold value amplifying unit 202 are the same configurations, and respectively include a transistor, a resistor, and a current source having the same characteristic. In other words, the first differential signal amplifying unit 200, the second differential signal amplifying unit 270, the first threshold value amplifying unit 201, and the second threshold value amplifying unit 202 amplify the input signals at the same amplification factor to output the amplified signals.

In the first differential signal amplifying unit 200, the noninverted signal included in the differential signal output from the DUT 101 is applied to the transistor 212, and the inverted signal included in the differential signal output from the DUT 101 is applied to the transistor 216. Then, the first differential signal amplifying unit 200 amplifies the noninverted signal and the inverted signal, inputs the amplified noninverted signal into the positive input terminal of the L side comparing circuit 206, and inputs the amplified inverted signal into the negative input terminal of the L side comparing circuit 206.

In the second differential signal amplifying unit 270, the noninverted signal included in the differential signal output from the DUT 101 is applied to the transistor 252, and the inverted signal included in the differential signal output from the DUT 101 is applied to the transistor 256. Then, the second differential signal amplifying unit 270 amplifies the noninverted signal and the inverted signal, inputs the amplified noninverted signal into the positive input terminal of the H side comparing circuit 204, and inputs the amplified inverted signal into the negative input terminal of the H side comparing circuit 204.

In the first threshold value amplifying unit 201, the reference voltage (Vref) generated based on the ground potential of the DUT 101 is applied to the transistor 222, and the first comparative voltage (VrefH) generated based on the ground potential of the DUT 101 is applied to the transistor 216. Then, the first threshold value amplifying unit 201 amplifies the reference voltage (Vref) and the first comparative voltage (VrefH), inputs the amplified reference voltage (Vref) into the positive input terminal of the H side comparing circuit 204, and inputs the amplified first comparative voltage (VrefH) into the negative input terminal of the H side comparing circuit 204.

In the second threshold value amplifying unit 202, the reference voltage (Vref) generated based on the ground potential of the DUT 101 is applied to the transistor 232, and the second comparative voltage (VrefL) generated based on the ground potential of the DUT 101 is applied to the transistor 236. Then, the second threshold value amplifying unit 202 amplifies the reference voltage (Vref) and the second comparative voltage (VrefL), inputs the amplified reference voltage (Vref) into the positive input terminal of the L side comparing circuit 206, and inputs the amplified second comparative voltage (VrefL) into the negative input terminal of the L side comparing circuit 206.

The H side comparing circuit 204 compares electric potential of the positive input terminal and electric potential of the negative input terminal to output its comparison result. In other words, the H side comparing circuit 204 detects that the sum of a voltage of the noninverted signal input from the second differential signal amplifying unit 270 and the reference voltage (Vref) input from the first threshold value amplifying unit 201 is larger than the sum of a voltage of the inverted signal input from the second differential signal amplifying unit 270 and the first comparative voltage (VrefH) input from the first threshold value amplifying unit 201, in order to output it as a comparison result.

The L side comparing circuit 206 compares electric potential of the positive input terminal and electric potential of the negative input terminal to output its comparison result. In other words, the L side comparing circuit 206 detects that the sum of a voltage of the noninverted signal input from the first differential signal amplifying unit 200 and the reference voltage (Vref) input from the second threshold value amplifying unit 202 is smaller than the sum of a voltage of the inverted signal input from the first differential signal amplifying unit 200 and the second comparative voltage (VrefL) input from the second threshold value amplifying unit 202, in order to output it as a comparison result.

As described above, since the first differential signal amplifying unit 200, the second differential signal amplifying unit 270, the first threshold value amplifying unit 201, and the second threshold value amplifying unit 202 are made up of a differential amplification circuit, it is possible to speed up an operation of the differential comparator circuit 118. Moreover, since the first differential signal amplifying unit 200, the second differential signal amplifying unit 270, the first threshold value amplifying unit 201, and the second threshold value amplifying unit 202 are made up of a differential amplification circuit having the same gain, it is possible to reduce a measurement error by nonlinearity of a gain of the first differential signal amplifying unit 200 and the second differential signal amplifying unit 270 and to accurately measure a cross-point of the differential signals. Therefore, according to the test apparatus 100 including the differential comparator circuit 118, it is possible to test the DUT 101 that outputs the differential signals with high precision.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

As apparent from the above descriptions, according to the present invention, it is possible to provide the differential comparator circuit capable of measuring the differential signals precisely.

What is claimed is:

1. A differential comparator circuit that is mounted on a test apparatus for testing a device under test outputting differential signals including noninverted signals and inverted signals, the differential comparator circuit comprising:
   a difference signal subtracting circuit operable to compute and output a difference signal indicative of a difference between the noninverted signal and the inverted signal;
   a first threshold value subtracting circuit operable to compute and output a first threshold voltage indicative of a difference between a first comparative voltage generated based on ground potential of the device under test and a reference voltage generated based on the ground potential of the device under test; and
   a first comparing circuit operable to compare the difference signal and the first threshold voltage to output a comparison result.

2. The differential comparator circuit as claimed in claim 1, wherein
   said difference signal subtracting circuit amplifies the difference between the noninverted signal and the inverted signal at a predetermined amplification factor to output the difference signal, and
   said first threshold value subtracting circuit amplifies the difference between the first comparative voltage and the reference voltage at the same predetermined amplification factor as that of said difference signal subtracting circuit in order to output the first threshold voltage.

3. The differential comparator circuit as claimed in claim 1, wherein
   the differential comparator circuit further comprises:
   a second threshold value subtracting circuit operable to compute and output a second threshold voltage indicative of a difference between a second comparative voltage generated based on the ground potential of the device under test and a reference voltage generated based on the ground potential of the device under test; and
   a second comparing circuit operable to compare the difference signal and the second threshold voltage and output a comparison result,
   said first comparing circuit detects and outputs that the difference signal is larger than the first threshold voltage, and
   said second comparing circuit detects and outputs that the difference signal is smaller than the second threshold voltage.

4. The differential comparator circuit as claimed in claim 3, wherein
   said first comparing circuit detects and outputs that the inverted signal is larger than the noninverted signal, and
   said second comparing circuit detects and outputs that the inverted signal is smaller than the noninverted signal.

5. The differential comparator circuit as claimed in claim 3, wherein
   said difference signal subtracting circuit amplifies the difference between the noninverted signal and the inverted signal at a predetermined amplification factor to output the difference signal, and
   said second threshold value subtracting circuit amplifies the difference between the second comparative voltage and the reference voltage at the same predetermined amplification factor as that of said difference signal subtracting circuit in order to output the second threshold voltage.

6. A test head of a test apparatus that tests a device under test outputting differential signals including noninverted signals and inverted signals, comprising:
   a test module operable to measure the differential signals, said test module comprising:
   a difference signal subtracting circuit that computes and outputs a difference signal indicative of a difference between the noninverted signal and the inverted signal;

a first threshold value subtracting circuit that computes and outputs a first threshold voltage indicative of a difference between a first comparative voltage generated based on ground potential of the device under test and a reference voltage generated based on the ground potential of the device under test; and a first comparing circuit that compares the difference signal and the first threshold voltage to output a comparison result.

7. A test apparatus that tests a device under test outputting differential signals including noninverted signals and inverted signals, comprising:

a test module operable to measure the differential signals, said test module comprising:

a difference signal subtracting circuit that computes and outputs a difference signal indicative of a difference between the noninverted signal and the inverted signal;

a first threshold value subtracting circuit that computes and outputs a first threshold voltage indicative of a difference between a first comparative voltage generated based on ground potential of the device under test and a reference voltage generated based on the ground potential of the device under test; and a first comparing circuit that compares the difference signal and the first threshold voltage to output a comparison result.

* * * * *